US012598798B2

(12) United States Patent
Zeng

(10) Patent No.: US 12,598,798 B2
(45) Date of Patent: Apr. 7, 2026

(54) SEMICONDUCTOR STRUCTURE AND MANUFACTURING METHOD THEREOF

(71) Applicant: CHANGXIN MEMORY TECHNOLOGIES, INC., Hefei City (CN)

(72) Inventor: Yizhi Zeng, Hefei City (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 613 days.

(21) Appl. No.: 18/149,735

(22) Filed: Jan. 4, 2023

(65) Prior Publication Data

US 2024/0014276 A1     Jan. 11, 2024

(30) Foreign Application Priority Data

Jul. 8, 2022     (CN) .......................... 202210800046.6

(51) Int. Cl.
   H10D 64/23     (2025.01)
   H10B 12/00     (2023.01)
   H10D 64/01     (2025.01)
(52) U.S. Cl.
   CPC ......... H10D 64/251 (2025.01); H10B 12/482 (2023.02); H10D 64/01 (2025.01)

(58) Field of Classification Search
   CPC .... H10D 64/251; H10D 64/01; H10B 12/482; H10B 12/053; H10B 12/315; H10B 12/30; H10B 12/02; H01L 21/76877
   See application file for complete search history.

(56) References Cited

U.S. PATENT DOCUMENTS

| | | | |
|---|---|---|---|
| 6,576,509 B1 | 6/2003 | Toyokawa et al. | |
| 9,529,956 B2 * | 12/2016 | Liao ......................... | H01L 21/76 |
| 11,145,727 B2 * | 10/2021 | Lee ...................... | H10D 64/679 |

FOREIGN PATENT DOCUMENTS

JP     2001057411 A     2/2001

* cited by examiner

*Primary Examiner* — David Vu
(74) *Attorney, Agent, or Firm* — Kilpatrick Townsend & Stockton LLP

(57)     ABSTRACT

The present disclosure provides a semiconductor structure and a manufacturing method thereof. The semiconductor structure includes a substrate and a contact structure. The substrate includes a shallow trench isolation (STI) structure and active structures separated by the STI structure. The contact structure includes a first contact structure and a second contact structure that are laminated, where the first contact structure covers a part of a top surface and a part of a side wall of the active structure.

18 Claims, 6 Drawing Sheets

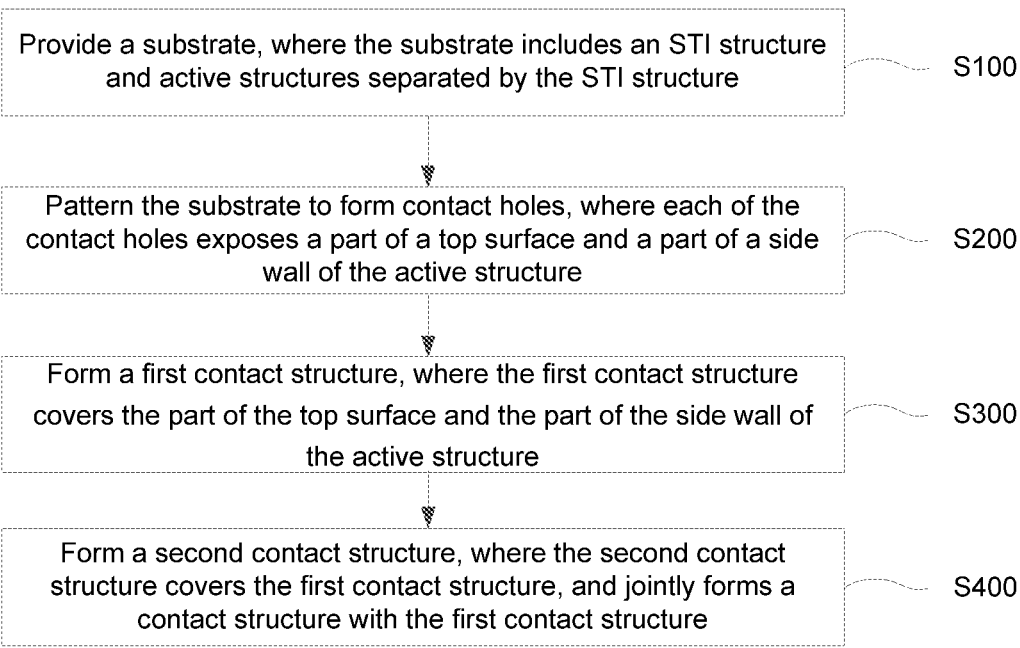

| | |
|---|---|
| Provide a substrate, where the substrate includes an STI structure and active structures separated by the STI structure | S100 |
| Pattern the substrate to form contact holes, where each of the contact holes exposes a part of a top surface and a part of a side wall of the active structure | S200 |
| Form a first contact structure, where the first contact structure covers the part of the top surface and the part of the side wall of the active structure | S300 |
| Form a second contact structure, where the second contact structure covers the first contact structure, and jointly forms a contact structure with the first contact structure | S400 |

FIG. 5

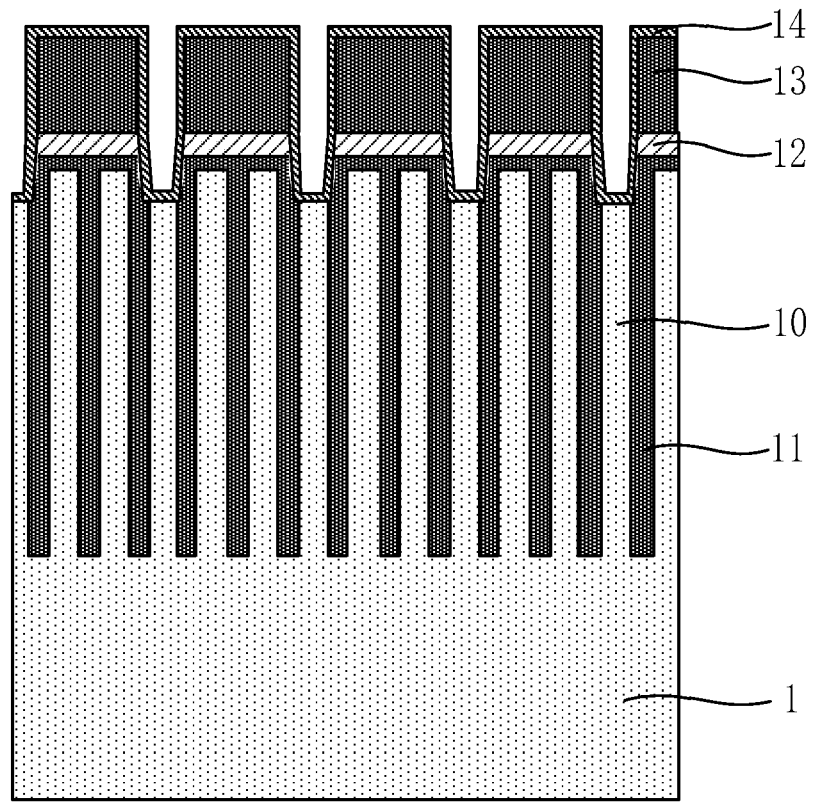

FIG. 6

SEMICONDUCTOR STRUCTURE AND MANUFACTURING METHOD THEREOF

CROSS-REFERENCE TO RELATED APPLICATION

This disclosure claims the priority of Chinese Patent Application No. 202210800046.6, submitted to the Chinese Intellectual Property Office on Jul. 8, 2022, the disclosure of which is incorporated herein in its entirety by reference.

TECHNICAL FIELD

The present disclosure relates to the technical field of semiconductors, and in particular to a semiconductor structure and a manufacturing method thereof.

BACKGROUND

As a semiconductor memory commonly used in an electronic device such as a computer, a dynamic random access memory (DRAM) includes a plurality of memory cells. Each memory cell generally includes a transistor and a capacitor. A gate of the transistor is electrically connected to a word line, a source of the transistor is electrically connected to a bit line, and a drain of the transistor is electrically connected to the capacitor. The transistor can be turned on and off through a word line voltage on the word line, so as to read data information stored in the capacitor or write data information into the capacitor through the bit line.

Currently, with the development of semiconductor technology, especially after the semiconductor process has entered the phase of deep submicron, the design size of the line width in the DRAM becomes smaller, and resistor capacitance characteristics of a bit line contact structure in the DRAM need to meet higher requirements. The resistor-capacitance characteristics of the bit line contact structure have a decisive influence on a driving current of the transistor. Therefore, if it is difficult to further optimize the resistor-capacitance characteristics of the bit line contact structure, e.g., to further reduce the contact resistance of the bit line contact structure, it is not conducive to improving the electrical performance of the DRAM.

Therefore, how to effectively reduce the contact resistance of the contact structure has become an urgent problem in the related technology.

SUMMARY

According to an aspect, some embodiments of the present disclosure provide a semiconductor structure, including: a substrate and a contact structure. The substrate includes a shallow trench isolation (STI) structure and active structures separated by the STI structure. The contact structure includes a first contact structure and a second contact structure that are laminated, where the first contact structure covers a part of a top surface and a part of a side wall of the active structure.

According to another aspect, some embodiments of the present disclosure provide a manufacturing method of a semiconductor structure, for manufacturing the semiconductor structure in the foregoing embodiments. The manufacturing method includes the following steps:

providing a substrate, where the substrate includes an STI structure and active structures separated by the STI structure;

patterning the substrate to form contact holes, where each of the contact holes exposes a part of a top surface and a part of a side wall of the active structure;

forming a first contact structure, where the first contact structure covers the part of the top surface and the part of the side wall of the active structure; and forming a second contact structure, where the second contact structure covers the first contact structure, and jointly forms a contact structure with the first contact structure.

BRIEF DESCRIPTION OF THE DRAWINGS

To describe the technical solutions in the embodiments of the present application or in the conventional art more clearly, the following briefly describes the accompanying drawings required for describing the embodiments or the conventional art. Apparently, the accompanying drawings in the following description show merely some embodiments of the present application, and a person of ordinary skill in the art may still derive other accompanying drawings from these accompanying drawings without creative efforts.

FIG. 5 is a flowchart of a manufacturing method of a semiconductor structure according to an embodiment;

FIG. 6 is a schematic structural diagram of a structure obtained after a mask layer, a mold layer, and a protective layer are formed according to an embodiment;

DETAILED DESCRIPTION

Figure 1:
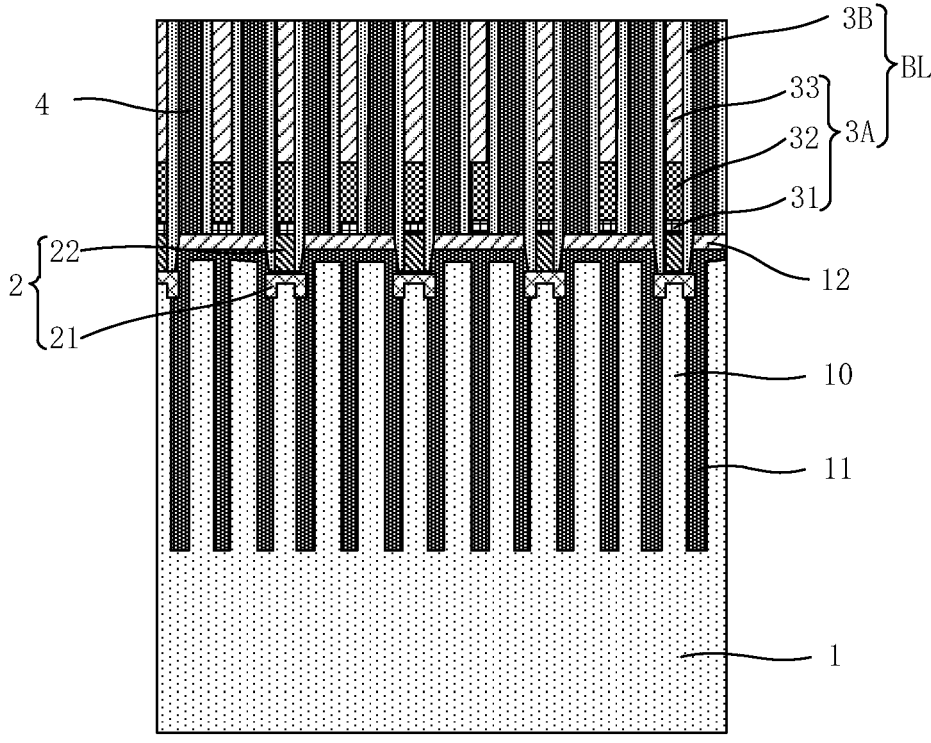
FIG. 1 is a schematic structural diagram of a semiconductor structure according to an embodiment.

To facilitate the understanding of the present application, the present application is described more completely below with reference to the accompanying drawings. The embodiments of the present application are provided in the accompanying drawings. However, the present application may be embodied in various forms without being limited to the embodiments described herein. These embodiments are provided in order to make the present application more thorough and comprehensive.

Unless otherwise defined, all technical and scientific terms used herein have the same meaning as commonly understood by those skilled in the technical field of the present application. The terms used herein are merely for the purpose of describing specific embodiments, and are not intended to limit the present application.

It should be understood that when an element or a layer is described as "being on", "being adjacent to", "being connected to" or "being coupled to" another element or layer, it can be on, adjacent to, connected to, or coupled to the another element or layer directly, or intervening elements or layers may be present. On the contrary, when an element is described as "being directly on", "being directly adjacent to", "being directly connected to" or "being directly coupled to" another element or layer, there are no intervening elements or layers.

It should be understood that although terms such as first and second may be used to describe various elements, components, regions, layers, doped types and/or sections, these elements, components, regions, layers, doped types and/or sections should not be limited by these terms. These terms are only used to distinguish one element, component, region, layer, doping type or section from another element, component, region, layer, doping type or section. Therefore, without departing from the teachings of the present disclosure, the first element, component, region, layer, doped type or section discussed below may a second element, component, region, layer or section.

Spatial relationship terms such as "under", "beneath", "lower", "below", "above", and "upper" can be used herein to describe the relationship shown in the figure between one element or feature and another element or feature. It should be understood that in addition to the orientations shown in the figure, the spatial relationship terms further include different orientations of used and operated devices. For example, if a device in the accompanying drawings is turned over, an element or feature described as being "beneath another element", "below it", or "under it" is oriented as being "on" the another element or feature. Therefore, the exemplary terms "beneath" and "under" may include two orientations of above and below. In addition, the device may further include other orientations (for example, a rotation by 90 degrees or other orientations), and the spatial description used herein is interpreted accordingly.

In the specification, the singular forms of "a", "an" and "the/this" may also include plural forms, unless clearly indicated otherwise. It should also be understood that the terms such as "including/comprising" and "having" indicate the existence of the stated features, wholes, steps, operations, components, parts or combinations thereof. However, these terms do not exclude the possibility of the existence of one or more other features, wholes, steps, operations, components, parts or combinations thereof. In this case, in this specification, the term "and/or" includes any and all combinations of related listed items.

Embodiments of the present disclosure are described herein with reference to cross-sectional illustrations that are schematic diagrams of idealized embodiments (and intermediate structures) of the present disclosure, such that variations shown in the shapes can be contemplated due to, for example, manufacturing techniques and/or tolerances. Therefore, the embodiments of the present disclosure should not be limited to the specific shapes of the regions shown herein, but include shape deviations due to, for example, manufacturing technologies. Therefore, the regions shown in the figure are schematic in nature, and their shapes are not intended to show the actual shapes of the regions of the device and limit the scope of the present disclosure.

With the development of semiconductor technology, especially after the semiconductor process has entered the phase of deep submicron, the design size of the line width in the DRAM becomes smaller, and resistor capacitance characteristics of a bit line contact structure in the DRAM need to meet higher requirements. The resistor-capacitance characteristics of the bit line contact structure have a decisive influence on a driving current of the transistor. Therefore, if it is difficult to further optimize the resistor-capacitance characteristics of the bit line contact structure, e.g., to further reduce the contact resistance of the bit line contact structure, it is not conducive to improving the electrical performance of the DRAM.

At present, it is difficult to change the line width of the DRAM to optimize the resistor-capacitance characteristics of the bit line contact structure from the perspective of the line width. In some examples, it is possible to increase the resistivity of the bit line contact structure and the material in the bit line, or to change part of the process to optimize the resistor-capacitance characteristics of the bit line contact structure, but it only brings little effect.

Accordingly, the embodiments of the present disclosure provide a semiconductor structure and a manufacturing method thereof, which can precisely control the width of each trench in the semiconductor structure, so as to form an isolation structure with a precise size in the trench, thereby effectively reducing the parasitic capacitance to improve the projection yield and electrical performance of the semiconductor structure. However, the embodiments of the present disclosure are not limited thereto, and can be applied to any trench structure of which the dimensional accuracy needs to be improved.

Figure 2:
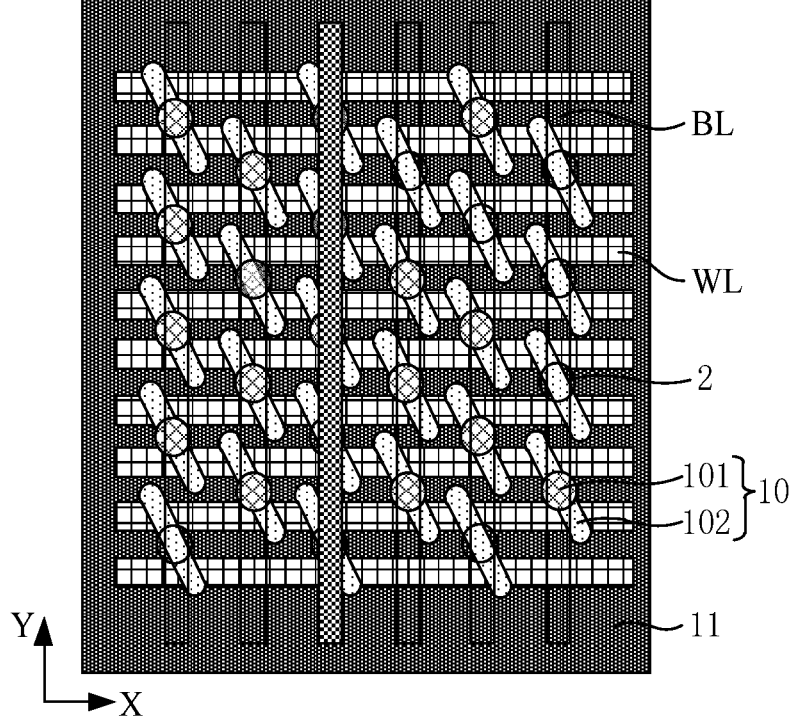
FIG. 2 is a schematic top view of a semiconductor structure according to an embodiment.

Referring to FIG. 1 and FIG. 2, some embodiments of the present disclosure provide a semiconductor structure, including: a substrate 1 and contact structures 2. The substrate 1 includes an STI structure 11, and active structures 10 separated by the STI structure 11. The contact structure 2 includes a first contact structure 21 and a second contact structure 22 that are laminated, where the first contact structure 21 covers a part of a top surface and a part of a side wall of the active structure 10.

Herein, the first contact structure 21 covering a part of the top surface and a part of the side wall of the active structure 10 means that the first contact structure 21 may semi-enclose a partial surface of the active structure 10 to have a large contact area.

For example, the substrate 1 may be made of a semiconductor material, an insulating material, a conductor material, or any combination thereof. The substrate 1 may be of a single-layer structure or a multi-layer structure. For example, the substrate 1 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. Alternatively, in another example, the substrate 1 may be a layered substrate including, for example, Si/SiGe, Si/SiC, silicon-on-insulator (SOI), or silicon-germanium-on-insulator.

In an example, the substrate 1 includes but is not limited to a silicon substrate or a silicon-based substrate. Optionally, the substrate 1 is a sapphire substrate, a silicon germanide substrate or a silicon carbide substrate.

For example, the STI structure 11 may be an oxide isolation structure, such as a silicon oxide ($SiO_2$) isolation structure.

For example, the active structure 10 may be a columnar structure. Orthographic projection of the active structure 10 on the surface of the substrate 1 may be in the shape of a circle, an ellipse, or a polygon.

In an example, as shown in FIG. 2, the active structures 10 separated by the STI structure 11 are arranged in an array. Specifically, the active structures are arranged in rows along a first direction (such as direction X), and arranged in columns along a second direction (such as direction Y). The first direction intersects with, e.g., is perpendicular to the second direction.

Optionally, the active structures 10 in adjacent rows are staggered from each other in the first direction.

Optionally, the active structures 10 in adjacent columns are staggered from each other in the second direction.

It may be understood that, in some examples, the semiconductor structure further includes a plurality of bit line structures BL arranged in parallel at intervals and a plurality of word line structures WL arranged in parallel at intervals. For example, the word line structure WL extends along the first direction (such as direction X), and the bit line structure BL extends along the second direction (such as direction Y). The bit line structure BL may further be connected to the active structures 10 in the corresponding column through the bit line contact structure. In other examples, the semiconductor structure further includes a plurality of memory capacitors arranged in an array. The memory capacitor may be connected to the corresponding active structure 10 through a storage node contact structure. Therefore, the contact structure 2 in the embodiment of the present disclosure may be the bit line contact structure described above, the storage node contact structure described above, or any other contact structure that needs to be connected to the active structure 10. This is not limited in the embodiments of the present disclosure.

In the embodiment of the present disclosure, further referring to FIG. 1, the contact structure 2 includes the laminated first contact structure 21 and the second contact structure 22, and the first contact structure 21 is provided to cover a part of the top surface and a part of the side wall of the active structure, which can increase a contact area between the first contact structure 21 and the active structure 10, that is, increase a contact area between the contact structure 2 and the active structure 10, thereby effectively reducing the contact resistance of the contact structure 2 while maintaining the minimum critical dimension of the semiconductor structure, so as to effectively improve the electrical performance of the semiconductor structure.

In some embodiments, the first contact structure 21 includes a silicide layer; and the second contact structure 22 includes a polysilicon layer. However, the present disclosure is not limited thereto. For example, the first contact structure 21 or the second contact structure 22 may further be made of a silicon germanide (SiGe) material or a silicon carbide (SiC) material.

In addition, the first contact structure 21 may be formed through a deposition process or may be formed through a silicon metallization process.

For example, the first contact structure 21 is formed through a silicon metallization process. For example, a metal layer is formed on the surface of the active structure 10 and a rapid thermal annealing process is performed, such that a part of the surface of the active structure 10 becomes a metal silicide layer, to form the first contact structure 21.

In some embodiments, referring to FIG. 2, the active structure 10 includes a first source/drain portion 101 located in a middle of the active structure 10 and a second source/drain portion 102 located at both sides of the first source/drain portion 101. A top surface of the first source/drain portion 101 is lower than a top surface of the second source/drain portion 102. The first source/drain portion 101 of the active structure 10 is connected to the contact structure 2, and the first contact structure 21 covers the top surface and a part of a side wall of the first source/drain portion 101 of the active structure 10.

It is understandable herein that, the first source/drain portion 101 in the active structure 10 refers to a part of the active structure 10 that is connected to the first contact structure 21. For example, the first source/drain portion 101 is located in the middle of the active structure 10, and may be formed by etching an initial active structure, such that a first contact hole is formed above and at both sides of the first source/drain portion 101 to accommodate the first contact structure 21. The first contact structure 21 may stretch across both sides of the first source/drain portion 101 and cover the top surface of the first source/drain portion 101. The second source/drain portion 102 refers to a part of the active structure 10 that is connected to a capacitor. For example, the second source/drain portion 102 is located at two end portions of the active structure 10. In addition, the area of the top surface of the first source/drain portion 101 and a recess depth relative to the second source/drain portion 102 may be controlled by controlling a corresponding etching depth and etching area. In this way, the connection between the first contact structure 21 and the active structure 10 is implemented by direct covering the top surface and part of the side wall of the first source/drain portion 101 by the first contact structure 21.

It is worth noticing that, in the embodiment of the present disclosure, the contact structure 2 includes the laminated first contact structure 21 and second contact structure 22. However, to adapt to different structure design requirements, the contact structure 2 may have many different implementations.

In some possible implementations, further referring to FIG. 1, orthographic projection of the second contact structure 22 on the substrate 1 is located within orthographic projection of the first contact structure 21 on the substrate 1, and a gap exists between a boundary of the orthographic projection of the second contact structure 22 on the substrate 1 and a boundary of the orthographic projection of the first contact structure 21 on the substrate 1.

It is understandable herein that the size of the second contact structure 22 may be designed according to the minimum critical dimension. For example, the contact structure 2 is a bit line contact structure, and a width of the second contact structure 22 may be kept the same as a line width of a conductive layer in the bit line structure BL.

On this basis, in the embodiment of the present disclosure, the width of the second contact structure 22 is set to be the same as the line width of a conductive structure (such as the bit line structure BL) that is in contact connection with the second contact structure 22, which helps ensure or increase the distribution density of corresponding conductive structures above the substrate 1, to implement high-density memory integration of the semiconductor structure. Moreover, in the embodiment of the present disclosure, the first contact structure 21 is configured with a planar area larger than that of the second contact structure 22, such that the contact resistance of the contact structure 2 can be effectively reduced by the first contact structure 21 while the high-density storage performance of the semiconductor structure is ensured by the second contact structure 22, thereby improving the electrical performance of the semiconductor structure.

Figure 3:
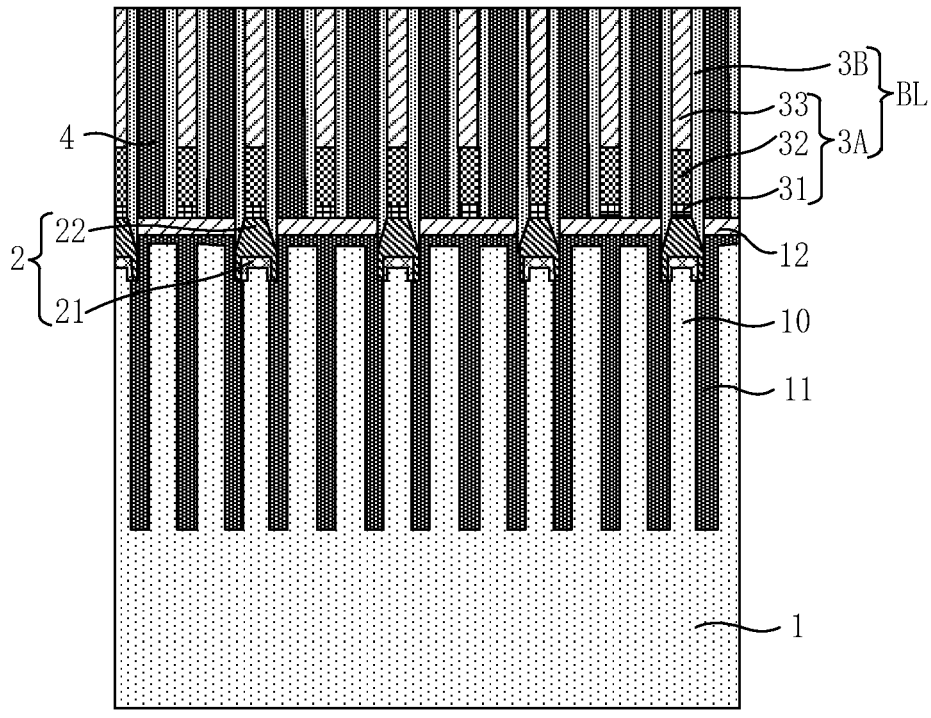
FIG. 3 is a schematic structural diagram of a semiconductor structure according to another embodiment.

In other possible implementations, referring to FIG. 3, orthographic projection of the first contact structure 21 on the substrate 1 is located within orthographic projection of the second contact structure 22 on the substrate 1, and the second contact structure 22 at least partially covers a top surface and a side wall of the first contact structure 21.

It can be learned with reference to the foregoing embodiments that, after the first contact hole is formed by etching the initial active structure, the first contact structure 21 may not fill up the bottom of the first contact hole. In this way, during subsequent forming of the second contact structure 22, it is ensured that the second contact structure 22 can at least partially cover the top surface and side wall of the first contact structure 21, thereby ensuring a large contact area of the contact structure 2, so as to further reduce the contact resistance of the contact structure 2.

Figure 4:
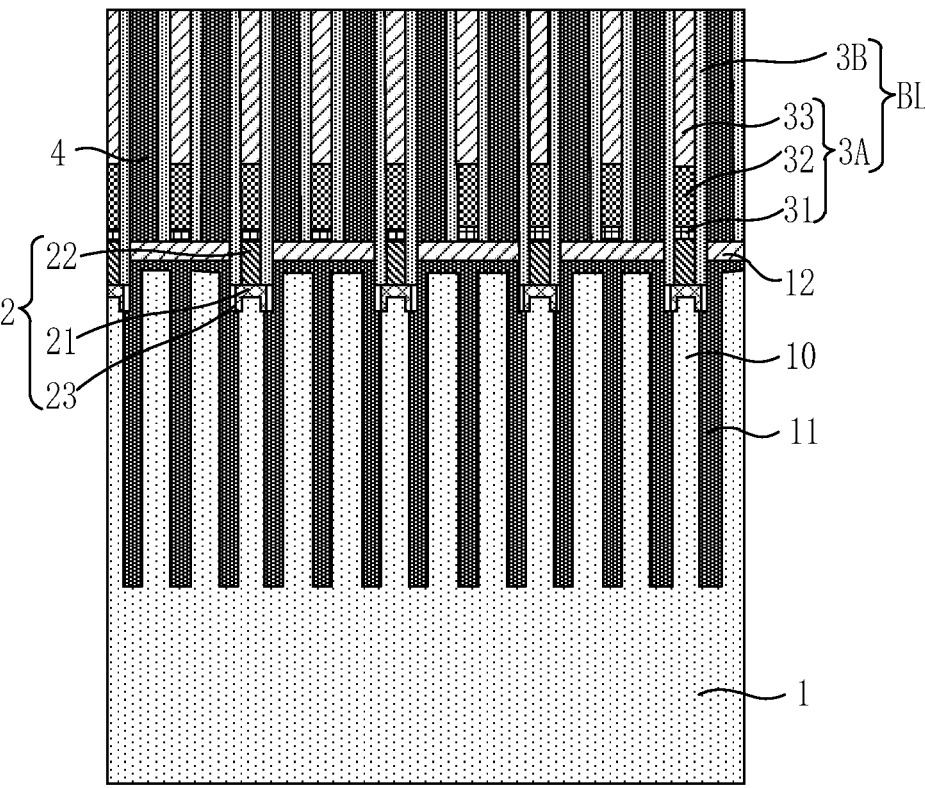
FIG. 4 is a schematic structural diagram of a semiconductor structure according to further another embodiment.

In other possible implementations, referring to FIG. 4, orthographic projection of the second contact structure 22 on the substrate 1 is located within orthographic projection of the first contact structure 21 on the substrate 1, the second contact structure 22 at least partially covers a top surface of the first contact structure 21, and an air gap 23 is formed between the first contact structure 21 and the STI structure 11.

It can be learned with reference to the foregoing embodiments that, after the first contact hole is formed by etching the initial active structure, the first contact structure 21 may not fill up the bottom of the first contact hole, such that an air gap 23 is formed between the first contact structure 21 and the STI structure 11. In this way, when another layer structure (such as a bit line sidewall) other than the second contact structure 22 is formed subsequently, the air gap 23 is sealed by the other layer structure.

In addition, in other possible implementations, alternatively, the orthographic projection of the first contact structure 21 on the substrate 1 may be located within the orthographic projection of the second contact structure 22 on the substrate 1, and the second contact structure 22 covers the top surface of the first contact structure 21. The air gap 23 is surrounded by the first contact structure 21, the STI structure 11, and the second contact structure 22. That is, after the air gap 23 is formed between the first contact structure 21 and the STI structure 11, the air gap 23 may be sealed by the second contact structure 22.

In the foregoing embodiments, the air gap 23 is formed between the first contact structure 21 and the STI structure 11, and the air gap 23 may also serve as a component of the contact structure 2, so as to further reduce the contact resistance of the contact structure 2 by the air gap 23.

Further referring to FIG. 1, FIG. 3 and FIG. 4, inn some embodiments, the substrate 1 further includes a mask layer 12 covering upper surfaces of the STI structure 11 and the active structure 10, and an upper surface of the second contact structure 22 and an upper surface of the mask layer 12 are located in a same plane.

For example, the mask layer 12 is a hard mask layer, such as a silicon nitride layer.

For example, the mask layer 12 may serve as a barrier layer. In this way, with the upper surface of the mask layer 12 as a reference, the second contact structure 22 whose upper surface is in a same plane with the upper surface of the mask layer 12 may be formed by an etching process or a grinding process.

It is understandable that, in some examples, the contact structure 2 may be a bit line contact structure. Further referring to FIG. 1 to FIG. 4, the semiconductor structure further includes: a bit line structure BL. The bit line structure BL is located above the second contact structure 22 and is connected to the second contact structure 22. The bit line structure BL includes a barrier layer 31 and a conductive layer 32 that are connected to the second contact structure 22, and a sidewall 3B located on side walls of the barrier layer 31 and the conductive layer 32.

For example, the bit line structure BL further includes a top isolation layer 33 located on a top of the conductive layer 32; the sidewall 3B further covers a side wall of the top isolation layer 33. The barrier layer 31, the conductive layer 32, and the top isolation layer 33 jointly form a bit line 3A.

Optionally, the top isolation layer 33 may be a nitride layer, such as a silicon nitride layer or a silicon oxynitride layer.

Optionally, the barrier layer 31 may be a titanium nitride layer.

Optionally, the conductive layer 32 may be a metal layer with good conductivity made of chromium (Cr), cadmium (Cd), iridium (Ir), niobium (Nb), tantalum (Ta), tellurium (Te) or tungsten (W).

Optionally, the sidewall 3B may be a single-layer structure or a multi-layer structure. For example, the sidewall 3B may be a laminated structure consisting of silicon oxide, silicon nitride, and silicon oxide.

Optionally, the sidewall 3B may further cover the side wall of the second contact structure 22, as shown in FIG. 1.

It should be additionally noted that, referring to FIG. 1, FIG. 3 and FIG. 4, in some embodiments, the semiconductor structure further includes a dielectric layer 4. The dielectric layer 4 fills up a gap between adjacent bit line structures BL and may be configured to isolate and/or support the adjacent bit line structures BL.

Optionally, the dielectric layer 4 may be an oxide layer, such as a silicon oxide layer.

Some embodiments of the present disclosure further provide a manufacturing method of a semiconductor structure, for manufacturing the semiconductor structure in the foregoing embodiments. Referring to FIG. 5, the manufacturing method includes the following steps:

S100: Provide a substrate, where the substrate includes an STI structure and active structures separated by the STI structure.

S200: Pattern the substrate to form contact holes, where each of the contact holes exposes a part of a top surface and a part of a side wall of the active structure.

S300: Form a first contact structure, where the first contact structure covers the part of the top surface and the part of the side wall of the active structure.

S400: Form a second contact structures, where the second contact structure covers the first contact structure, and jointly forms a contact structure with the first contact structure.

In some embodiments, the contact hole includes a first contact hole and a second contact hole. Step S200 of patterning the substrate to form contact holes further includes the following steps:

S210: Pattern the substrate to form the first contact holes, where each of the first contact holes exposes the active structure and the STI structure.

S220: Etch back the STI structure exposed in the first contact hole, to form the second contact holes that each expose a part of the side wall of the active structure.

In the embodiment of the present disclosure, after the first contact hole is formed to expose the active structure and the STI structure, by etching back the STI structure, the second contact hole exposing a part of the side wall of the active structure can be formed, such that the first contact structure that can cover a part of the top surface and a part of the side wall of the active structure is formed in the second contact hole. Therefore, the manufacturing method of a semiconductor structure provided by the embodiment of the present disclosure is simple and easy to implement, which helps improve the production efficiency and yield of the semiconductor structure.

In some embodiments, step S300 of forming first contact structures in the contact holes include: forming the first contact structure in the contact hole by a deposition process; or performing silicon metallization on a part of the top surface and a part of side wall of the active structure that are exposed by the contact hole, to form the first contact structure.

In some embodiments, after the first contact structure is formed in the contact hole in step S300, the manufacturing method further includes: performing a rapid thermal annealing.

In some embodiments, the substrate further includes a mask layer covering upper surfaces of the STI structure and the active structure. Step S400 of forming the second contact structure in the contact hole includes the following steps:

S410: Deposit a second contact material layer, where the contact holes are filled with the second contact material layer, and the second contact material layer covers an upper surface of the substrate.

S420: Partially remove the second contact material layer, to form an initial second contact structure whose upper surface is flush with an upper surface of the mask layer.

S430: Pattern the initial second contact structure to form the second contact structure.

In some embodiments, before step S430, the manufacturing method further includes: forming a bit line material layer covering the initial second contact structure and the substrate. Step S430 of patterning the initial second contact structure includes: patterning the bit line material layer and the initial second contact structure, to form a bit line and the second contact structure.

In some embodiments, a gap exists between the second contact structure and a side wall of the contact hole. The manufacturing method further includes: forming a sidewall that fills up the gap and covers a side wall of the bit line.

To more clearly describe the manufacturing method of a semiconductor structure provided by the embodiments of the present disclosure, description is made below in detail by the semiconductor structure shown in FIG. 1 as an example.

In step S100, referring to FIG. 6, a substrate 1 is provided, where the substrate 1 includes an STI structure 11 and active structures 10 separated by the STI structure 11.

For example, the substrate 1 may be made of a semiconductor material, an insulating material, a conductor material, or any combination thereof. The substrate 1 may be of a single-layer structure or a multi-layer structure. For example, the substrate 1 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. Alternatively, in another example, the substrate 1 may be a layered substrate including, for example, Si/SiGe, Si/SiC, silicon-on-insulator (SOI), or silicon-germanium-on-insulator.

In an example, the substrate 1 includes but is not limited to a silicon substrate or a silicon-based substrate. Optionally, the substrate 1 is a sapphire substrate, a silicon substrate, or a silicon carbide substrate.

For example, the STI structure 11 may be an oxide isolation structure, such as a silicon oxide ($SiO_2$) isolation structure.

For example, the active structure 10 may be a columnar structure. Orthographic projection of the active structure 10 on the surface of the substrate 1 may be in the shape of a circle, an ellipse, or a polygon.

For example, with reference to FIG. 2, the active structure 10 includes a first source/drain portion 101 located in a middle of the active structure 10 and a second source/drain portion 102 located at both sides of the first source/drain portion 101. A top surface of the first source/drain portion 101 is lower than a top surface of the second source/drain portion 102. The first source/drain portion 101 of the active structure 10 is connected to the contact structure 2, and the first contact structure 21 covers the top surface and a part of a side wall of the first source/drain portion 101 of the active structure 10.

In an example, the active structures 10 separated by the STI structure 11 are arranged in an array. For example, the active structures are arranged in rows along a first direction, and arranged in columns along a second direction. The first direction intersects with, e.g., is perpendicular to the second direction. Optionally, the active structures 10 in adjacent rows are staggered from each other in the first direction. Optionally, the active structures 10 in adjacent columns are staggered from each other in the second direction.

In addition, further referring to FIG. 6, optionally, a mask layer 12, a mold layer 13, and a protective layer 14 are laminated on the substrate 1. For example, the mask layer 12 may be a hard mask layer, such as a silicon nitride layer. The mold layer 13 may be a spin coating mask layer, such as a silicon oxide layer. Mask patterns may be formed in the mask layer 12 and the mold layer 13. The protective layer 14 is configured to protect exposed surfaces of the STI structure 11, the mask layer 12, and the mold layer 13 when the contact holes are formed subsequently. For example, the protective layer 14 is polysilicon layer.

Figure 7:
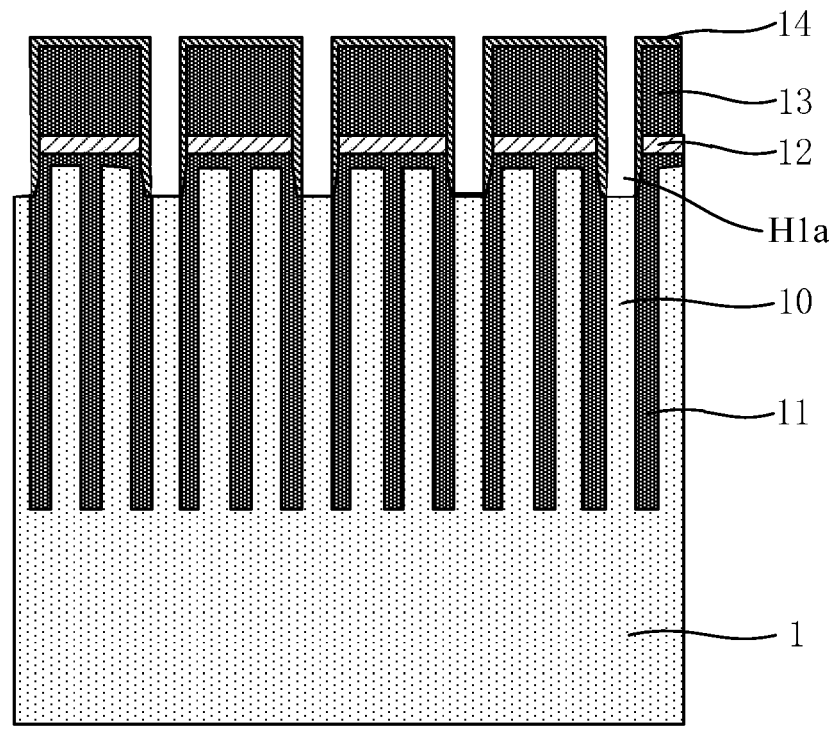
FIG. 7 is a schematic structural diagram of a structure obtained after first contact holes are formed according to an embodiment.
Figure 8:
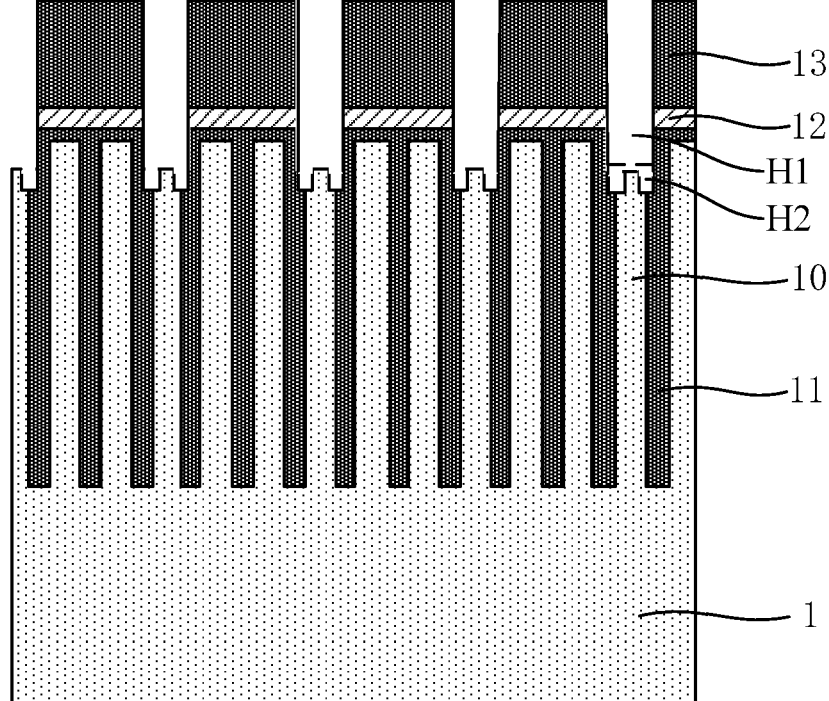
FIG. 8 is a schematic structural diagram of a structure obtained after second contact holes are formed according to an embodiment.

In step S200, referring to FIG. 7 and FIG. 8, the substrate 1 is patterned to form the contact holes, where the contact hole exposes a part of the top surface and a part of the side wall of the active structure 10.

For example, in step S210, referring to FIG. 7 and FIG. 8, the substrate 1 is patterned to form first contact holes H1, where each of the first contact hole H1 exposes the active structure 10 and the STI structure 11, Herein, in the example in which the mask layer 12, the mold layer 13, and the protective layer 14 are formed on the substrate 1, the patterning the substrate 1 may include: patterning the protective layer 14, to form initial first contact holes H1a each at least exposing the active structure 10, and then removing the protective layer 14, to obtain the first contact holes H1. The first contact hole H1 further exposes a part of the STI structure 11.

In step S220, referring to FIG. 8, the STI structure 11 exposed in the first contact hole H1 is etched back, to form the second contact hole H2 that exposes a part of the side wall of the active structure 10.

Herein, optionally, while the STI structure 11 exposed in the first contact hole H1 is etched back, a part of the side wall of the active structure 10 may be etched back simultaneously.

Optionally, an exposure depth of the side wall of the active structure 10 may be 10 nm±2 nm. That is, after the first contact hole H1 is formed, etching may be further continued downward to form the second contact hole H2 having a depth of approximately 10 nm.

Thus, the first contact hole H1 and the second contact hole H2 jointly form the foregoing contact hole.

Figure 9:
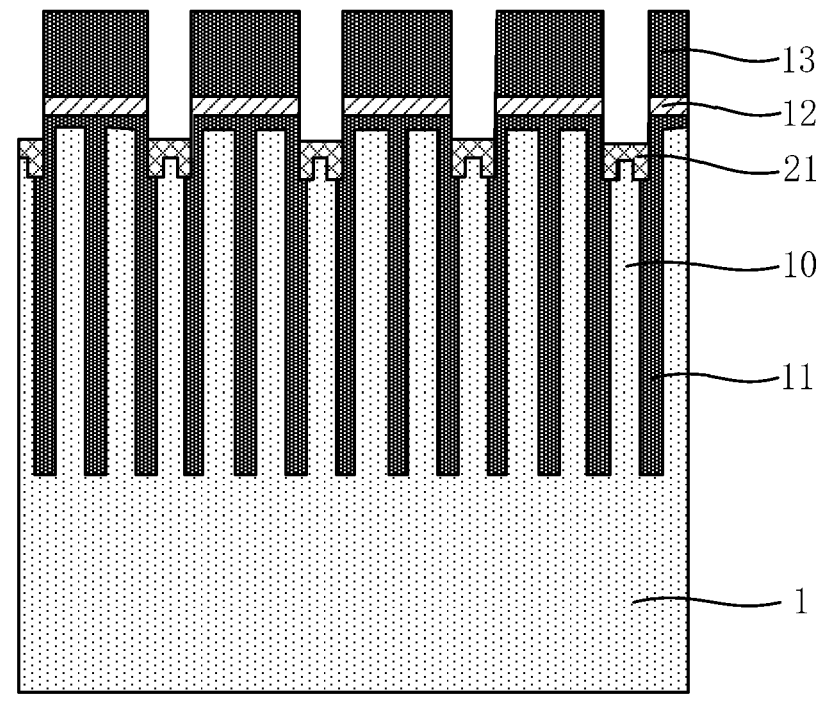
FIG. 9 is a schematic structural diagram of a structure obtained after a first contact structure is formed according to an embodiment.

In step S300, referring to FIG. 9, the first contact structure 21 is formed, where the first contact structure 21 covers a part of the top surface and a part of the side wall of the active structure 10.

Optionally, the first contact structure 21 is formed in the contact hole by a deposition process. The first contact structure 21 may be a silicide layer, such as a metal silicide layer.

Optionally, silicon metallization is performed on a part of the top surface and a part of the side wall of the active structure that are exposed by the contact hole, to form the first contact structure.

In addition, in examples in which the second contact structure 22 further covers the side wall of the first contact structure 21, or the air gap 23 is formed between the first contact structure 21 and the STI structure 11, the first contact structure 21 does not fill up the bottom of the contact hole (that is, the second contact hole).

In some embodiments, the manufacturing method further includes: performing a rapid thermal annealing.

In this case, an annealing temperature and annealing time of the rapid thermal annealing may be set according to an actual requirement. This is not limited in this embodiment of the present disclosure. Moreover, the step of the rapid thermal annealing may be directly performed after the first contact structures 21 are formed, or may be performed after the second contact structures 22 are subsequently formed.

In the embodiment of the present disclosure, by performing rapid thermal annealing on the structure obtained after the first contact structures 21 are formed, the first contact structures 21 can better adhere to the active structures 10, or the first contact structures 21 are further distributed in the active structures 10, thereby effectively improving the contact interface quality and contact effect of the active structures 10. For example, it helps enhance the Schottky barrier between the active structure 10 and the contact structure 2, thus improving the electrical performance of the semiconductor structure.

Figure 10:
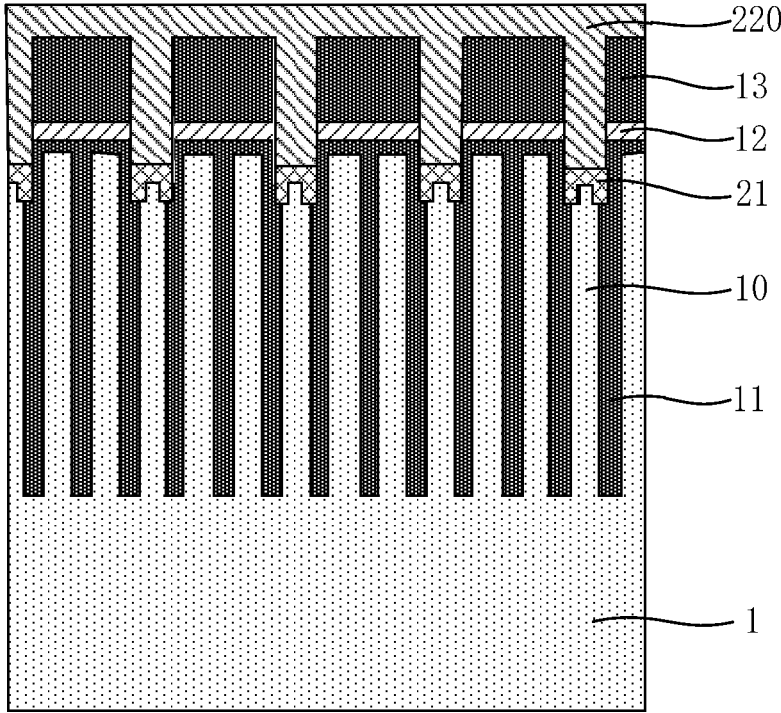
FIG. 10 is a schematic structural diagram of a structure obtained after a second contact structure material layer is formed according to an embodiment.
Figure 11:
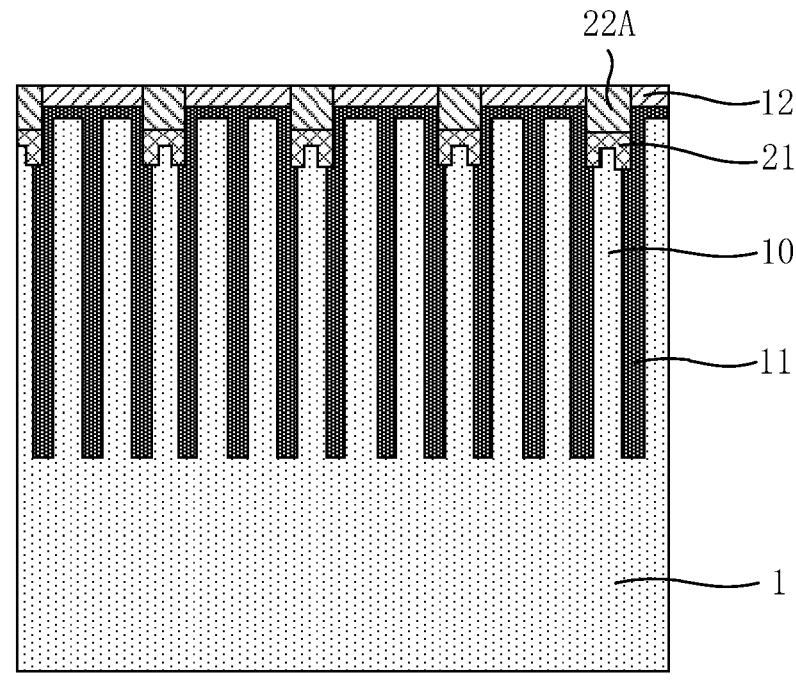
FIG. 11 is a schematic structural diagram of a structure obtained after an initial second contact structure is formed according to an embodiment.
Figure 12:
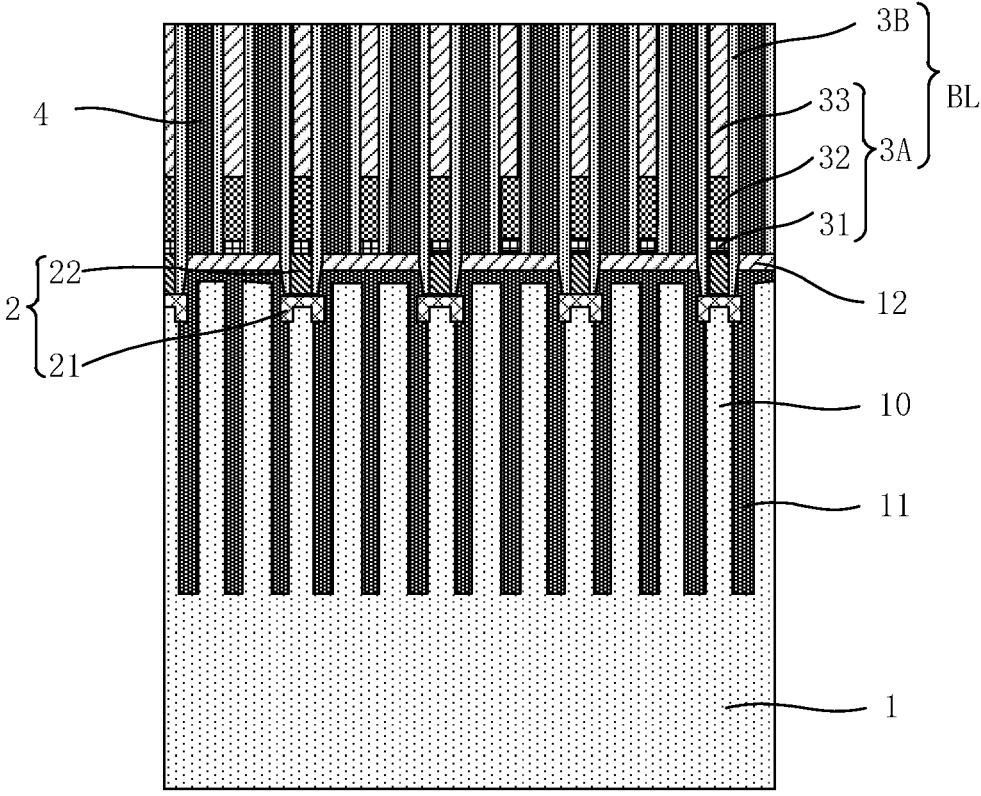
FIG. 12 is a schematic structural diagram of a structure obtained after a contact structure and a bit line are formed according to an embodiment.

In step S400, referring to FIG. 10 to FIG. 12, the second contact structures 22 are formed, where the second contact structure 22 covers the first contact structure 21, and jointly forms the contact structure 2 with the first contact structure 21.

In some embodiments, referring to FIG. 10, the substrate 1 further includes a mask layer 12 and a mold layer 13 that cover upper surfaces of the STI structure 11 and the active structure 10. In step S410, the second contact material layer 220 is deposited, where the contact holes are filled with the second contact material layer 220, and the second contact material layer 220 covers the upper surface of the substrate 1 (such as the upper surface of the mold layer 13).

Optionally, the second contact material layer 220 may be a polysilicon material layer, a silicon germanide material layer or a silicon carbide material layer.

In step S420, referring to FIG. 11, the second contact material layer 220 is partially removed, to form the initial second contact structure 22A whose upper surface is flush with the upper surface of the mask layer 12.

In addition, optionally, by the mask layer 12 as a barrier layer, the mold layer 13 and a part of the second contact material layer 220 are removed simultaneously.

Optionally, the mold layer 13 and a part of the second contact material layer 220 may be removed through etching or grinding.

On this basis, referring to FIG. 12, in some embodiments, the manufacturing method further includes: forming a bit line material layer covering the initial second contact structure 22A and the substrate 1.

In addition, it may be understood that, the bit line material layer can match structures in various layers of the bit line structure BL. The bit line material layer can cover the upper surfaces of the mask layer 12 and the initial second contact structure 22A.

For example, the bit line material layer includes a barrier material layer, a conductive material layer, and a top isolation material layer that are sequentially laminated. The barrier material layer may be a titanium nitride material layer; the conductive material layer may be a layer made of a material such as chromium, cadmium, iridium, niobium, tantalum, tellurium or tungsten. The top isolation material layer may be a nitride material layer, such as a silicon nitride material layer or a silicon oxynitride material layer.

In step S430, further referring to FIG. 12, the initial second contact structure 22A is patterned, to form the second contact structure 22.

It is understandable that in the example of forming the bit line material layer, the bit line material layer and the initial second contact structure may be patterned simultaneously. That is, the patterning the initial second contact structure 22A includes: patterning the bit line material layer and the initial second contact structure, to form the bit line 3A and the second contact structure 22 respectively.

Correspondingly, the barrier material layer in the bit line material layer is patterned to form the barrier layer 31 of the bit line 3A; the conductive material layer in the bit line material layer is patterned to form the conductive layer 32 of the bit line 3A; the top isolation material layer in the bit line material layer is patterned to form the top isolation layer 33 of the bit line 3A.

On this basis, a gap exists between the second contact structure 22 and the side wall of the contact hole (for example, the STI structure 11). The manufacturing method further includes: forming a sidewall 3B that fills up the gap and covers a side wall of the bit line 3A. That is, the sidewall 3B further covers a part of the side wall of the second contact structure 22.

Optionally, the sidewall 3B may be a single-layer structure or a multi-layer structure. For example, the sidewall 3B may be a laminated structure consisting of silicon oxide, silicon nitride, and silicon oxide. In this way, the structures in various layers of the sidewall 3B are sequentially laminated.

Thus, the bit line 3A and the sidewall 3B jointly form the bit line structure BL.

In some embodiments, further referring to FIG. 12, the manufacturing method further includes: forming a dielectric layer 4. The dielectric layer 4 fills up a gap between adjacent bit line structures BL and may be configured to isolate and/or support the adjacent bit line structures BL.

In the specification, the description of terms such as "some embodiments", "other embodiments", "desirable embodiments" and the like means that a specific feature, structure, material or characteristic described in combination with the embodiment(s) or example(s) are included in at least one embodiment or example of the present disclosure. In the specification, the schematic description of the above terms does not necessarily refer to the same embodiment or example.

The technical characteristics of the above embodiments can be employed in arbitrary combinations. In an effort to provide a concise description of these embodiments, not all possible combinations of all technical characteristics of the embodiments are described; however, these combinations of technical characteristics should be construed as disclosed in the description as long as no contradiction occurs.

The foregoing embodiments are intended to illustrate several implementations of the present application in detail, and they should not be construed as a limitation to the patentable scope of the present application. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A semiconductor structure, comprising:
a substrate, comprising a shallow trench isolation (STI) structure, and active structures separated by the STI structure, wherein the active structure comprises a first source/drain portion located in a middle of the active structure and a second source/drain portion located at both sides of the first source/drain portion; and a top surface of the first source/drain portion is lower than a top surface of the second source/drain portion; and
a contact structure, wherein the contact structure comprises a first contact structure and a second contact structure that are laminated;
wherein the first contact structure covers a part of a top surface and a part of a side wall of the active structure, the first source/drain portion of the active structure is connected to the contact structure, and the first contact structure covers the top surface and a part of a side wall of the first source/drain portion of the active structure.

2. The semiconductor structure according to claim 1, wherein orthographic projection of the second contact structure on the substrate is located within orthographic projection of the first contact structure on the substrate, and a gap exists between a boundary of the orthographic projection of the second contact structure on the substrate and a boundary of the orthographic projection of the first contact structure on the substrate.

3. The semiconductor structure according to claim 1, wherein orthographic projection of the first contact structure on the substrate is located within orthographic projection of the second contact structure on the substrate, and the second contact structure at least partially covers a top surface and a side wall of the first contact structure.

4. The semiconductor structure according to claim 1, wherein orthographic projection of the second contact structure on the substrate is located within orthographic projection of the first contact structure on the substrate, the second contact structure at least partially covers a top surface of the first contact structure, and an air gap is formed between the first contact structure and the STI structure.

5. The semiconductor structure according to claim 1, wherein the substrate further comprises a mask layer covering upper surfaces of the STI structure and the active structure, an upper surface of the second contact structure and an upper surface of the mask layer being located in a same plane.

6. The semiconductor structure according to claim 1, the semiconductor structure further comprises: a bit line structure, wherein the bit line structure is located above the second contact structure and is connected to the second contact structure; and
the bit line structure comprises a barrier layer and a conductive layer that are connected to the second contact structure, and a sidewall located on side walls of the barrier layer and the conductive layer.

7. The semiconductor structure according to claim 1, wherein
the first contact structure comprises a silicide layer; and
the second contact structure comprises a polysilicon layer.

8. A manufacturing method of a semiconductor structure, comprising:
providing a substrate, wherein the substrate comprises an STI structure and active structures separated by the STI structure;
patterning the substrate to form contact holes, wherein each of the contact holes exposes a part of a top surface and a part of a side wall of the active structure; wherein the contact holes comprise a first contact hole and a second contact hole;
forming a first contact structure, wherein the first contact structure covers the part of the top surface and the part of the side wall of the active structure; and
forming a second contact structure, wherein the second contact structure covers the first contact structure, and jointly forms a contact structure with the first contact structure;
wherein after the forming a first contact structure, the manufacturing method further comprises: performing a rapid thermal annealing; and
wherein patterning the substrate to form contact holes further comprises: patterning the substrate to form the first contact holes, wherein each of the first contact holes exposes the active structure and the STI structure; and etching back the STI structure exposed in the first contact hole, to form the second contact hole that exposes a part of the side wall of the active structure.

9. The manufacturing method of a semiconductor structure according to claim 8, wherein the forming a first contact structure comprises:
forming the first contact structure in the contact hole by a deposition process; or
performing silicon metallization on a part of the top surface and a part of the side wall of the active structure that are exposed by the contact hole, to form the first contact structure.

10. The manufacturing method of a semiconductor structure according to claim 8, wherein the substrate further comprises a mask layer covering upper surfaces of the STI structure and the active structure; and the forming a second contact structure comprises:
depositing a second contact material layer, wherein the contact holes are filled with the second contact material layer, and the second contact material layer covers an upper surface of the substrate;
partially removing the second contact material layer, to form an initial second contact structure whose upper surface is flush with an upper surface of the mask layer; and
patterning the initial second contact structure to form the second contact structure.

11. The manufacturing method of a semiconductor structure according to claim 10, wherein before the patterning the initial second contact structure, the manufacturing method further comprises: forming a bit line material layer covering the initial second contact structure and the substrate; and
the patterning the initial second contact structure comprises: patterning the bit line material layer and the initial second contact structure, to form a bit line and the second contact structure.

12. The manufacturing method of a semiconductor structure according to claim 11, wherein a gap exists between the second contact structure and a side wall of the contact hole; and the manufacturing method further comprises: forming a sidewall that fills up the gap and covers a side wall of the bit line.

13. The manufacturing method of a semiconductor structure according to claim 8, wherein the forming a first contact structure comprises:
forming the first contact structure in the contact hole by a deposition process; or
performing silicon metallization on a part of the top surface and a part of the side wall of the active structure that are exposed by the contact hole, to form the first contact structure.

14. The manufacturing method of a semiconductor structure according to claim 8, wherein after the forming a first contact structure, the manufacturing method further comprises: performing a rapid thermal annealing.

15. A semiconductor structure, comprising:
a substrate, comprising a shallow trench isolation (STI) structure, and active structures separated by the STI structure;
a contact structure, wherein the contact structure comprises a first contact structure and a second contact structure that are laminated, the first contact structure comprises a silicide layer; and the second contact structure comprises a polysilicon layer;
wherein the first contact structure covers a part of a top surface and a part of a side wall of the active structure; and
a bit line structure, wherein the bit line structure is located above the second contact structure and is connected to the second contact structure; and
the bit line structure comprises a barrier layer and a conductive layer that are connected to the second contact structure, and a sidewall located on side walls of the barrier layer and the conductive layer.

16. The semiconductor structure according to claim 15, wherein orthographic projection of the second contact structure on the substrate is located within orthographic projection of the first contact structure on the substrate, and a gap exists between a boundary of the orthographic projection of the second contact structure on the substrate and a boundary of the orthographic projection of the first contact structure on the substrate.

17. The semiconductor structure according to claim 15, wherein orthographic projection of the second contact structure on the substrate is located within orthographic projection of the first contact structure on the substrate, the second contact structure at least partially covers a top surface of the first contact structure, and an air gap is formed between the first contact structure and the STI structure.

18. The semiconductor structure according to claim 15, wherein the substrate further comprises a mask layer covering upper surfaces of the STI structure and the active structure, an upper surface of the second contact structure and an upper surface of the mask layer being located in a same plane.

* * * * *